United States Patent
Hui et al.

(10) Patent No.: US 7,679,129 B1
(45) Date of Patent: Mar. 16, 2010

(54) SYSTEM AND METHOD FOR IMPROVING OXIDE-NITRIDE-OXIDE (ONO) COUPLING IN A SEMICONDUCTOR DEVICE

(75) Inventors: Angela T. Hui, Fremont, CA (US); Unsoon Kim, San Jose, CA (US); Hiroyuki Kinoshita, San Jose, CA (US); Kuo-Tung Chang, Saratoga, CA (US)

(73) Assignees: Spansion LLC, Sunnyvale, CA (US); GlobalFoundries, Sunnyvale, CA (US)

( * ) Notice: Subject to any disclaimer, the term of this patent is extended or adjusted under 35 U.S.C. 154(b) by 90 days.

(21) Appl. No.: 11/128,389

(22) Filed: May 13, 2005

(51) Int. Cl.
*H01L 29/94* (2006.01)
(52) U.S. Cl. .................. 257/316; 257/E21.68
(58) Field of Classification Search .................. 257/316, 257/E21.68
See application file for complete search history.

(56) References Cited

U.S. PATENT DOCUMENTS

| | | | |
|---|---|---|---|
| 5,998,301 A | 12/1999 | Pham et al. ................. 438/701 |
| 6,291,296 B1 | 9/2001 | Hui et al. .................... 438/257 |
| 6,323,516 B1 | 11/2001 | Wang et al. ................. 257/315 |
| 6,720,610 B2 * | 4/2004 | Iguchi et al. ................ 257/315 |
| 6,797,565 B1 | 9/2004 | Yang et al. .................. 438/261 |
| 6,812,514 B1 | 11/2004 | Yang et al. .................. 257/314 |
| 6,818,462 B1 | 11/2004 | Yang et al. .................... 438/17 |
| 2002/0179962 A1 * | 12/2002 | Kinoshita ................... 257/315 |
| 2004/0021168 A1 * | 2/2004 | Himeno et al. .............. 257/314 |
| 2004/0201058 A1 * | 10/2004 | Sonoda et al. .............. 257/314 |

* cited by examiner

*Primary Examiner*—Bradley K Smith
*Assistant Examiner*—Amar Movva
(74) *Attorney, Agent, or Firm*—Harrity & Harrity, LLP (57) ABSTRACT

A memory device includes a substrate and a first dielectric layer formed over the substrate. At least two charge storage elements are formed over the first dielectric layer. The substrate and the first dielectric layer include a shallow trench filled with an oxide material. The oxide material formed in a center portion of the shallow trench is removed to provide a region with a substantially rectangular cross-section.

9 Claims, 8 Drawing Sheets

SYSTEM AND METHOD FOR IMPROVING OXIDE-NITRIDE-OXIDE (ONO) COUPLING IN A SEMICONDUCTOR DEVICE

TECHNICAL FIELD

The present invention relates generally to semiconductor manufacturing and, more particularly, to fabrication of memory devices.

BACKGROUND ART

Conventional semiconductor flash or block erase Electrically Erasable Programmable Read-Only Memory (Flash EEPROM) devices include arrays of cells that can be independently programmed and read. The size of each cell and thereby the memory device are made small by omitting transistors known as select transistors that enable the cells to be erased independently. As a result, a group of the cells must be erased together as a block.

Flash memory devices of this type may include individual memory cells characterized by a vertical stack of a tunnel oxide (e.g., $SiO_2$), a polysilicon floating gate over the tunnel oxide, an interlayer dielectric over the floating gate, and a control gate over the interlayer dielectric. The vertical stack may be formed on a crystalline silicon substrate. The substrate may include a channel region positioned below the vertical stack and source and drain on opposing sides of the channel region. Various voltages may be applied to the cell elements to program the cell with a binary 1 or 0, to erase all or some of the cells as a block, to read the cell, to verify that the cell is erased, or to verify that the cell is not over-erased.

Another type of memory cell structure is characterized by a vertical stack that includes an insulating tunnel oxide layer, a charge trapping nitride layer, an insulating top oxide layer, and a polysilicon control gate, all positioned on top of a crystalline silicon substrate. This particular structure of a silicon channel region, tunnel oxide, nitride, top oxide, and polysilicon control gate is often referred to as a SONOS (silicon-oxide-nitride-oxide-silicon) device.

Memory cells in a flash memory device are typically connected in an array of rows and columns, with the control gates of the cells in a row being connected to a respective word line and the drains of the cells in a column being connected to a respective bit line. To operate efficiently and reliably, each cell must be effectively isolated from neighboring cells.

As the dimensions of such memory devices have shrunk, isolation techniques have transitioned from conventional local oxidation of silicon ("LOCOS") isolation techniques to shallow trench isolation ("STI"). In fabricating an STI structure, a trench is created in the substrate between active regions of neighboring cells. The trench is filled with a field oxide (FOX) material which isolates neighboring cells from each other. Unfortunately, conventional STI fabrication techniques fail to provide suitably efficient and reliable isolation.

Accordingly, there is a need for an improved STI structure and fabrication technique for optimizing performance of flash memory devices.

DISCLOSURE OF THE INVENTION

In an implementation consistent with the principles of the invention, a memory device is provided. The memory device includes a substrate and a first dielectric layer formed over the substrate. At least two charge storage elements are formed over the first dielectric layer. The substrate and the first dielectric layer include a shallow trench filled with an oxide material. The oxide material formed in a center portion of the shallow trench is removed to provide a region with a substantially rectangular cross-section.

In another implementation consistent with the principles of the invention, a method is provided for forming a memory device. The method includes forming a first dielectric layer over a substrate; etching the first dielectric layer and the substrate to form a trench; filling the trench with a field oxide material; forming at least two charge storage elements over opposite sides of the trench; and etching the field oxide material to form an intergate dielectric region positioned between adjacent charge storage elements.

In yet another implementation consistent with the principles of the invention, a non-volatile memory array is provided. The non-volatile memory array includes a plurality of memory cells. A plurality of isolation regions are provided separating the plurality of memory cells, each of the isolation regions comprising a trench formed in a substrate and an oxide formed in the trench, wherein the oxide located in a center portion of an upper portion of the trench is removed. Each of the plurality of memory cells comprises: a first dielectric layer formed over the substrate; a charge storage element formed over the first dielectric layer; an intergate dielectric formed over the charge storage element, the intergate dielectric extending into the center portion of the upper portion of the trench; and a control gate formed over a portion of the intergate dielectric.

BRIEF DESCRIPTION OF THE DRAWINGS

The accompanying drawings, which are incorporated in and constitute a part of this specification, illustrate an embodiment of the invention and, together with the description, explain the invention. In the drawings.

BEST MODE FOR CARRYING OUT THE INVENTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
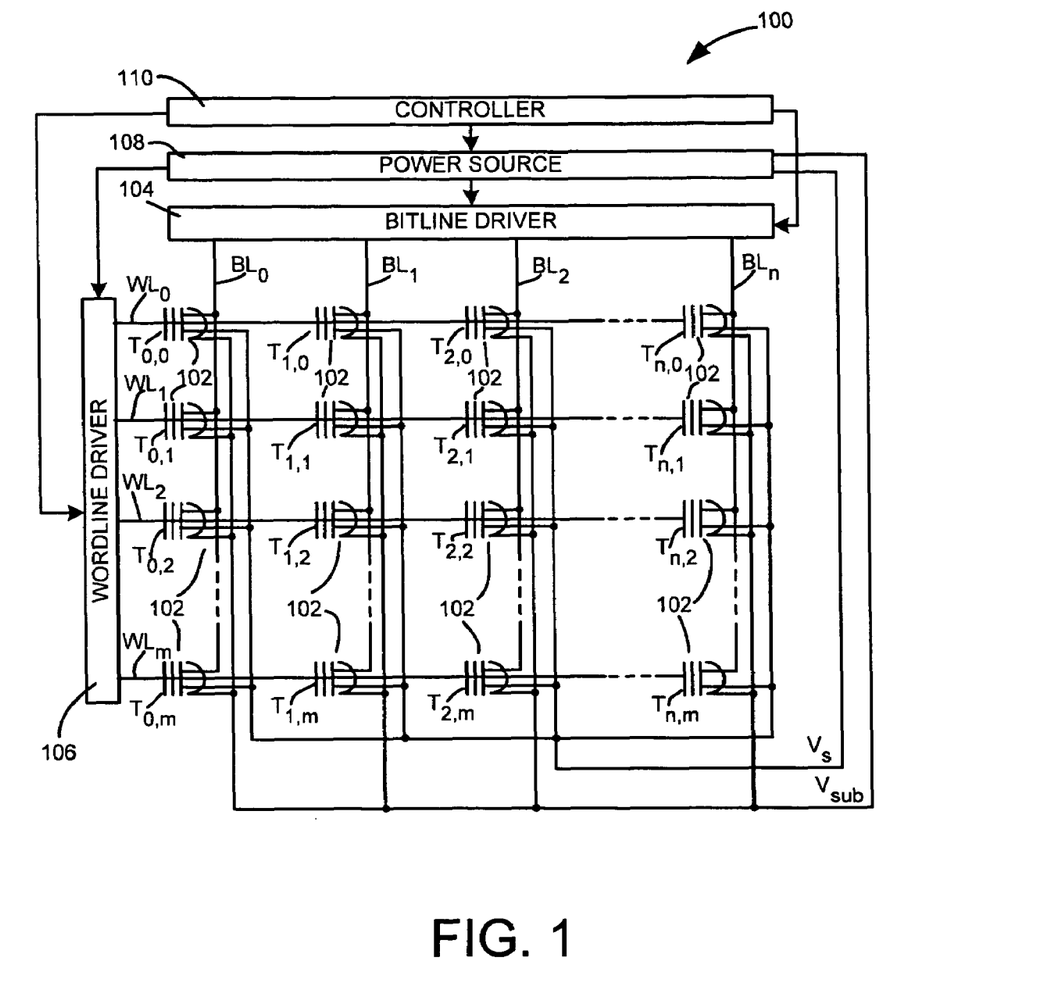
FIG. 1 illustrates an exemplary configuration of a flash EEPROM 100 formed in accordance with an embodiment of the present invention.

Implementations consistent with the present invention provide non-volatile memory devices with improved ONO to floating gate coupling, such as flash electrically erasable programmable read only memory (EEPROM) devices. FIG. 1 illustrates an exemplary configuration of a flash EEPROM 100 formed in accordance with an embodiment of the present invention. Flash memory 100 may include a plurality of memory cells 102, arranged in a rectangular matrix or array of rows and columns, a plurality of bit lines (BL) associated with each column, a plurality of word lines (WL) associated with each row, a bit line driver 104, a word line driver 106, a power source 108 and a controller 110.

Assuming that there are n columns and m rows in EEPROM 100, the bit lines may be designated as $BL_0$ to $BL_n$ and the word lines may be designated as $WL_0$ to $WL_m$. Accordingly, there may be n+1 bit lines and m+1 word lines. Bit line driver 104 applies appropriate voltages to the bit lines. Similarly, appropriate voltages are applied to the word lines by word line driver 106. The voltages applied to drivers 104 and 106 may be generated by a power source 108 under the control of a controller 110, which may include on-chip logic circuitry. The controller 110 may also control the drivers 104 and 106 to address the memory cells individually or collectively.

A memory cell 102 is located at each junction of a word line and a bit line. Each cell 102 includes a Metal-Oxide-Semiconductor (MOS) Field Effect Transistor (FET) having a source and drain formed in a semiconductor substrate, a floating gate, and a control gate separated from the floating gate by an oxide-nitride-oxide (ONO) stack. Additional details regarding the formation of cell 102 will be described below in relation to FIGS. 2-13. As should be appreciated, the cells of a flash EEPROM differ from conventional FETs in that they include the floating gate and tunnel oxide layer disposed between the control gate and the semiconductor substrate in which the source and drain are formed.

Cells 102 illustrated in FIG. 1 may be designated using the notation $T_{i,j}$, where j is the row (word line) number and i is the column (bit line) number. The control gates of cells 102 are connected to respective word lines, and the drains of cells 102 are connected to respective bit lines as illustrated. The sources of all of the cells are connected to the power source 108.

EXEMPLARY PROCESSING

Figure 2:
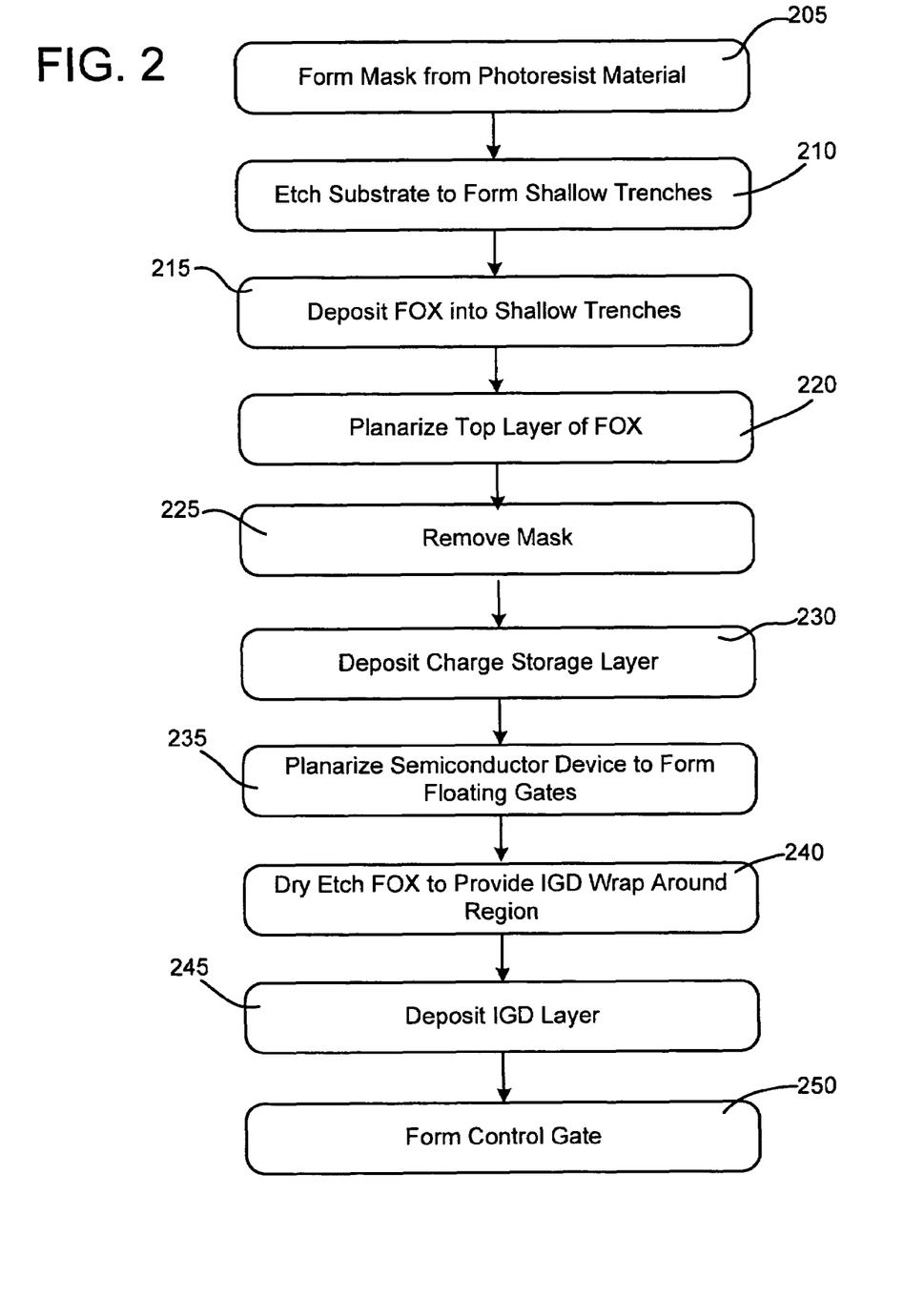
FIG. 2 is a flow diagram illustrating an exemplary process for forming a semiconductor memory device in an implementation consistent with the principles of the invention.

FIG. 2 illustrates an exemplary process for forming a semiconductor memory device in an implementation consistent with the principles of the invention. In one implementation, the semiconductor memory device includes an array of memory cells of a flash memory device, such as that illustrated in FIG. 1. FIGS. 3-13 illustrate exemplary views of a semiconductor memory device fabricated according to the processing described in FIG. 2.

Figure 3:
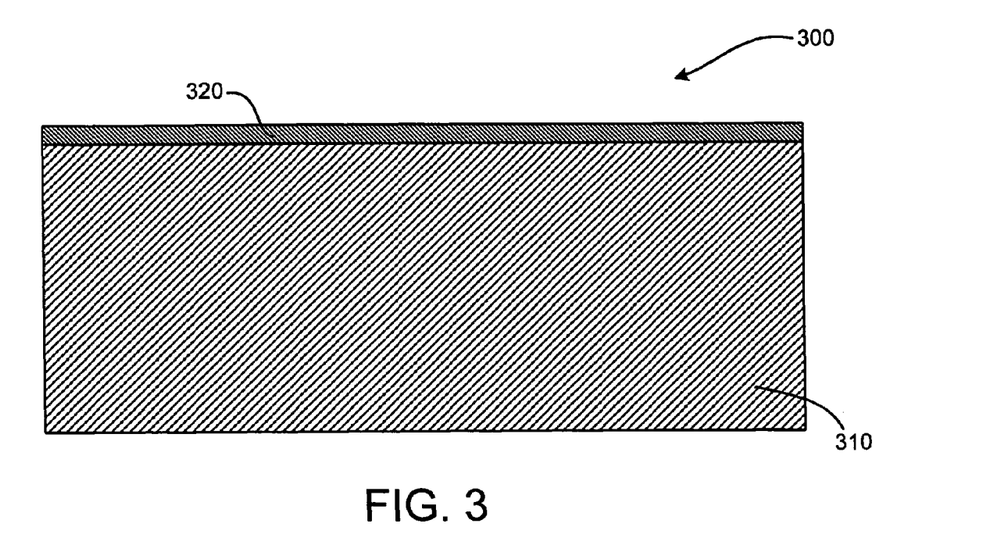
FIGS. 3-13 illustrate exemplary views of a semiconductor memory device fabricated according to the processing described in FIG. 2.

With reference to FIGS. 2 and 3, processing may begin with a semiconductor device 300 that includes layers 310 and 320. In an exemplary embodiment, layer 310 may include a substrate of semiconductor device 300 and may include silicon, germanium, silicon-germanium or other semiconducting materials. In alternative implementations, layer 310 may be a conductive layer or a dielectric layer formed a number of layers above the surface of a substrate in semiconductor device 300.

Layer 320 may be a dielectric layer formed on layer 310 in a conventional manner. In an exemplary implementation, dielectric layer 320 may include an oxide, such as a silicon oxide (e.g., $SiO_2$), and may have a thickness ranging from about 50 Å to about 350 Å. Dielectric layer 320 may function as a tunnel oxide layer for a subsequently formed memory cell of semiconductor device 300. In one implementation consistent with principles of the invention, a suitable method for forming layer 320 may be a thermal oxidation process of layer 310 at a temperature of about 750° C. to 950° C. Alternatively, dielectric layer 320 may be deposited using a low pressure chemical vapor deposition (LPCVD) process performed at a temperature of about 400° C. to 800° C. In addition, an optional nitride layer (not shown) may be formed on layer 320.

Figure 4:
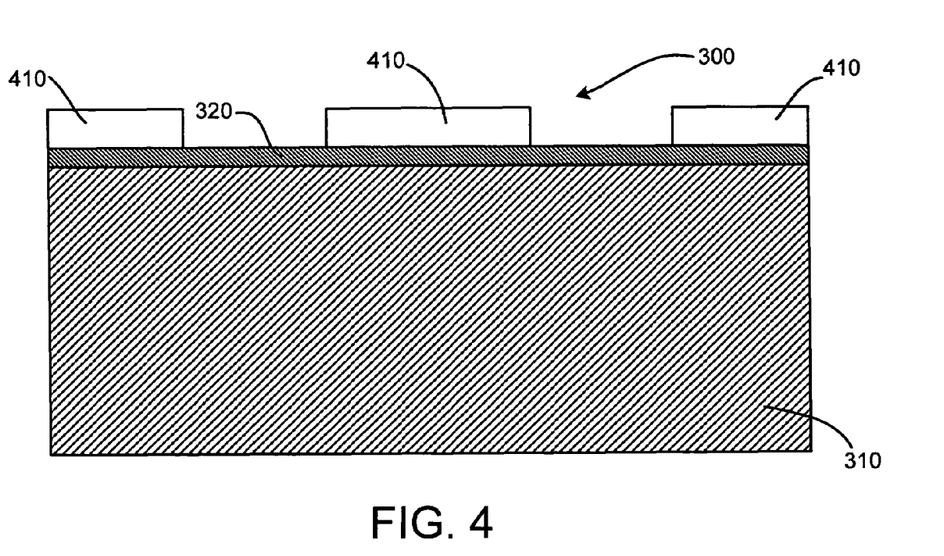
Figure 5:
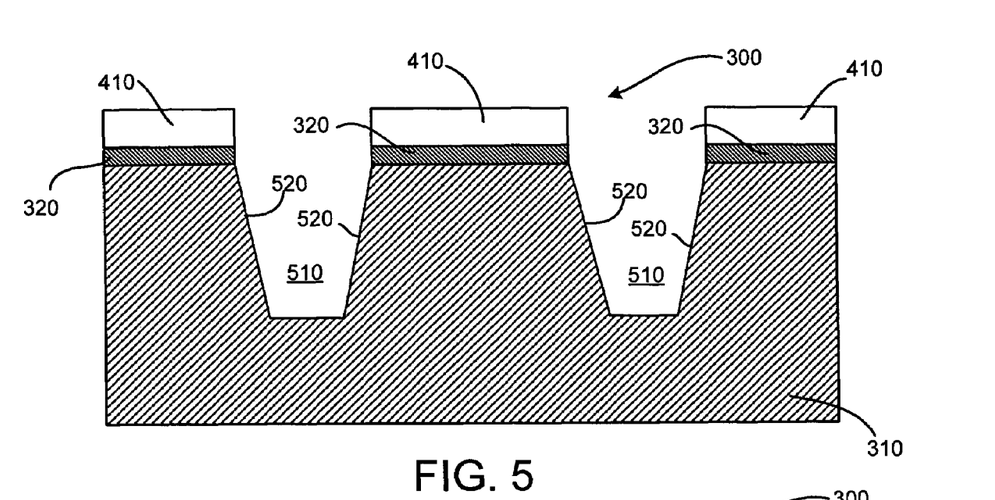
Figure 6:
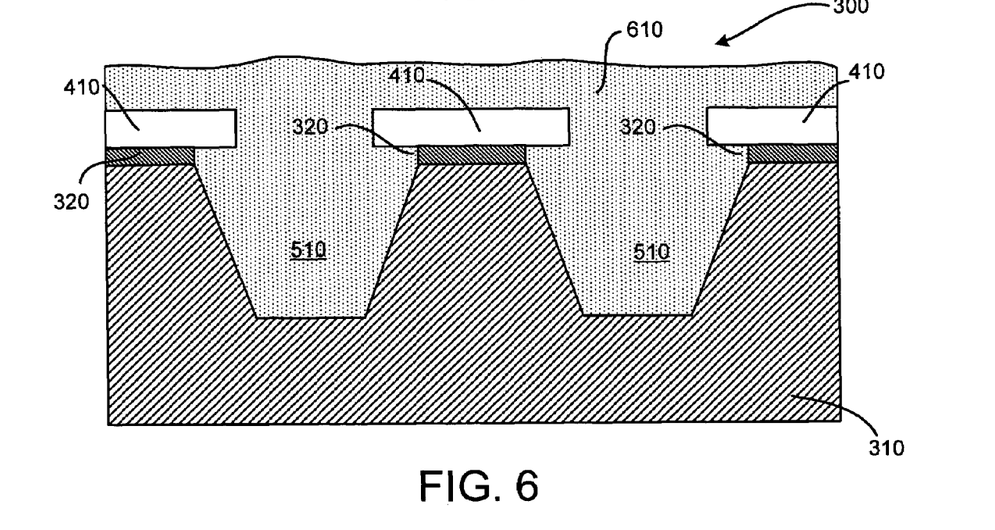
Figure 7:
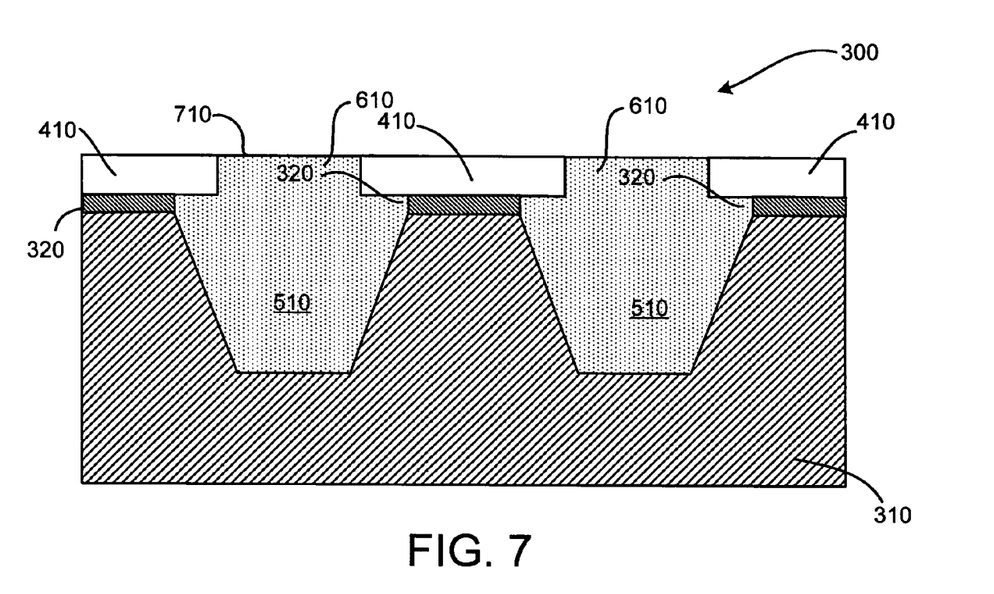

A photoresist material may be patterned and etched to form hard masks 410 on the top surface of layer 320, as illustrated in FIG. 4 (act 205). Masks 410 may be used to define active regions in the subsequently formed memory device and indicate areas that will not be etched during formation of isolation regions in semiconductor device 300. In one exemplary implementation, masks 410 may be formed of a nitride material (e.g., $Si_3N_4$). Semiconductor device 300 may then be etched, as illustrated in FIG. 5, to remove portions of layers 310 and 320 thereby forming shallow trenches 510 (act 210). The etch may also be referred to as a shallow trench isolation (STI) etch. In one implementation consistent with principles of the invention, trenches 510 may be formed to include sloping sidewalls 520 that slope inward between 82° and 88° from the upper surface of layer 320. A field oxide (FOX) layer 610 may then be deposited into trenches 510, as illustrated in FIG. 6 (act 215). In one implementation consistent with principles of the invention, FOX layer 610 may be deposited by high density plasma chemical vapor deposition (HDP CVD), although suitable alternative deposition techniques may also be employed. FOX layer 610 may also be planarized using, for example, a chemical mechanical polishing (CMP) process to form a planar top surface 710, as illustrated, in FIG. 7 (act 220).

Figure 8:
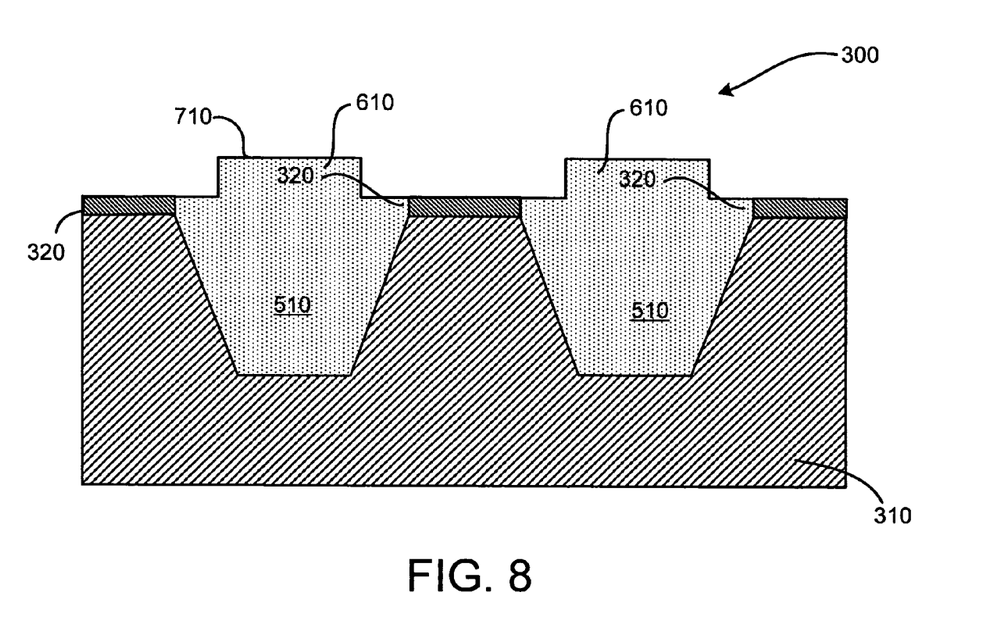

Semiconductor device 300 may then be etched, as illustrated in FIG. 8, to remove masks 410 (act 225). For example, semiconductor device 300 may be etched to approximately the upper surface of dielectric layer 320. In one exemplary implementation, a suitable method for stripping mask layer 410 may be a hot phosphoric acid etching that limits the etching to only the mask layer (e.g., nitride) material. In this manner, a portion of FOX layer 610 forms a protrusion above the surface of trenches 510, as illustrated in FIG. 8.

Figure 9:
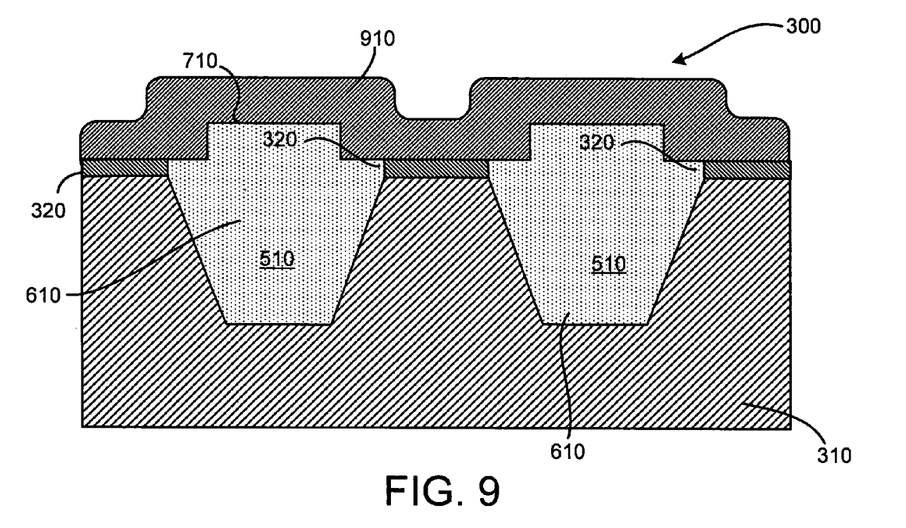

A layer 910 may be formed on layer 320 and field oxide layer 610 in a conventional manner and may include a material, such as polysilicon or silicon nitride, as shown in FIG. 9 (act 230). Layer 910, consistent with principles of the invention, may act as a charge storage layer for semiconductor device 300 and may have a thickness ranging from about 400 Å to about 1500 Å.

Figure 10:
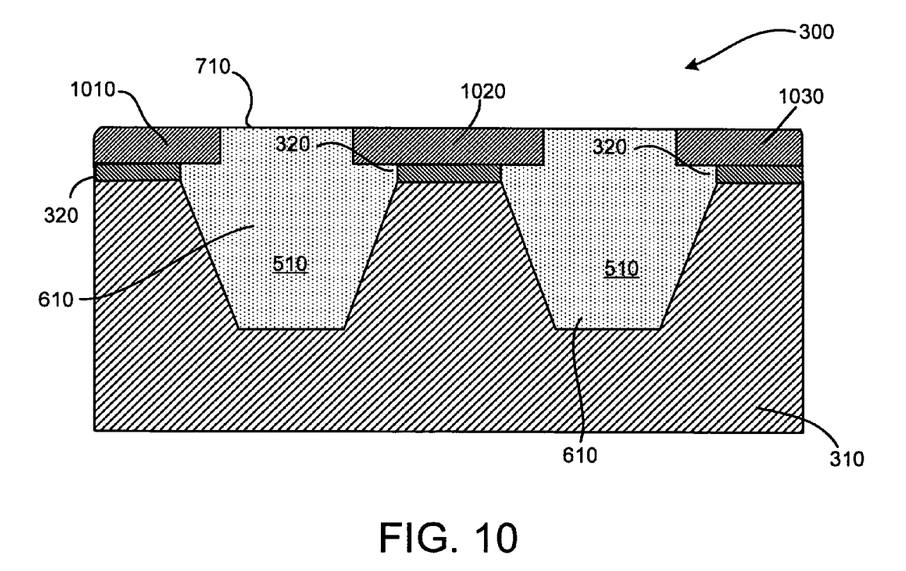

A planarization process may then be performed to remove a predetermined amount of excess material from layer 910 and FOX layer 610, as illustrated in FIG. 10, thereby forming floating gates 1010, 1020, and 1030 (act 235). Floating gates 1010, 1020, and 1030 may represent floating gate electrodes of separate memory cells in semiconductor device 300. For example, a CMP may be performed to remove the desired portions of layers 910 and 610. Layers 910 and 610 may also be planarized by an etch back or other suitable planarization technique.

Figure 11:
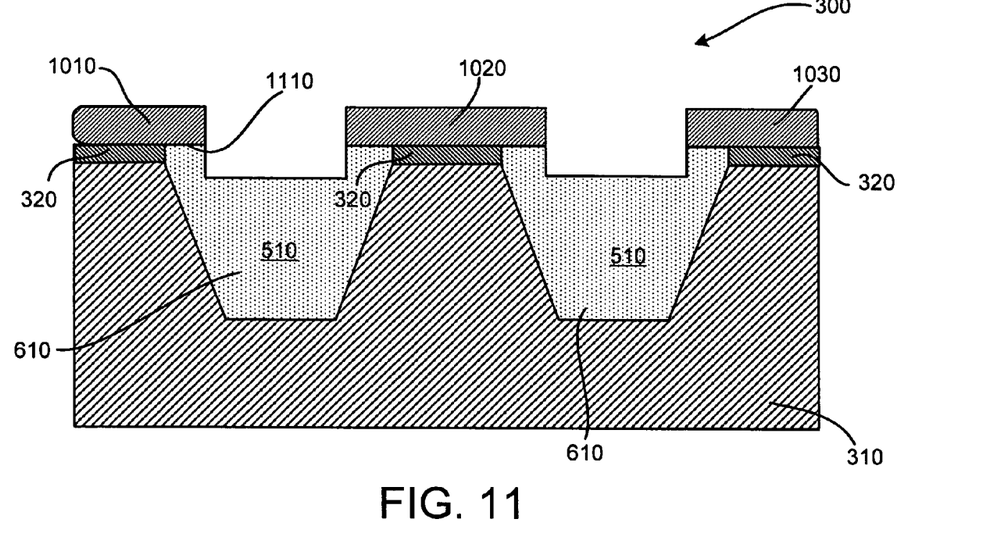

Following planarization, FOX layer may be etched to a predetermined depth using floating gates 1010, 1020, and 1030 as the etching masks, as illustrated in FIG. 11, to remove portions of field oxide layer 610 and provide a region for an intergate dielectric material to wrap around floating gates 1010, 1020, and 1030 (act 240). In one implementation consistent with principles of the invention, this etching is performed using a dry, high selective oxide, plasma etch, wherein plasma ions are used to bombard the surface of layer 610 and etch away a desired amount of material. Moreover, dry plasma etching is anisotropic in nature, thereby preventing undesirable undercutting of floating gates 1010, 1020, and 1030 and lateral portions of FOX layer 610, resulting in improved resistance to leakage through a subsequently formed ONO stack. In one implementation consistent with principles of the invention, FOX layer 610 may be etched to a level below a surface 1110 of FOX layer 610 that contacts floating gates 1010, 1020, and 1030, as shown in FIG. 11.

More specifically, the etch may be in the range of approximately 100 Å to 200 Å below surface 1110.

Figure 12:
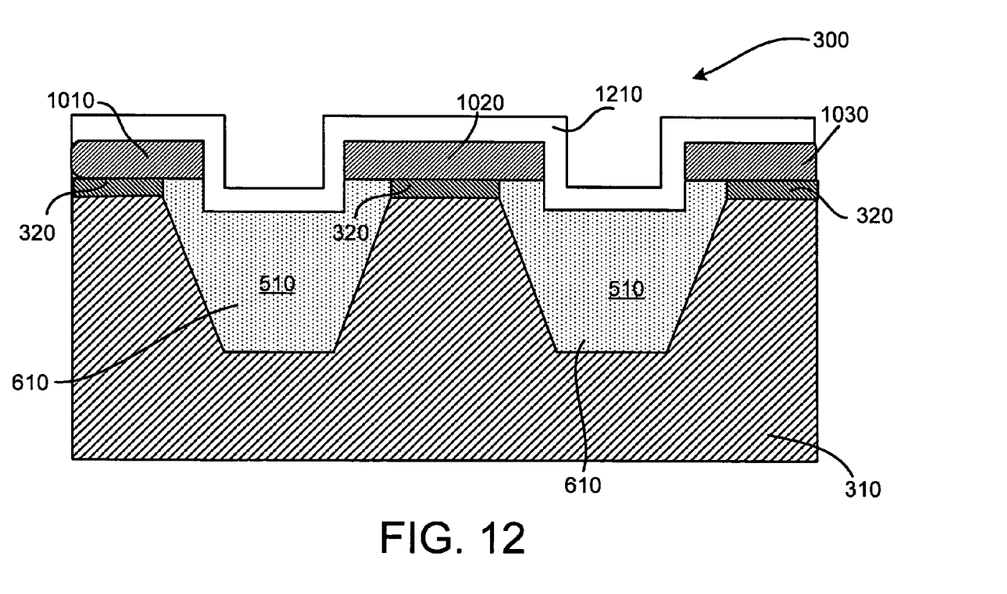
Figure 13:
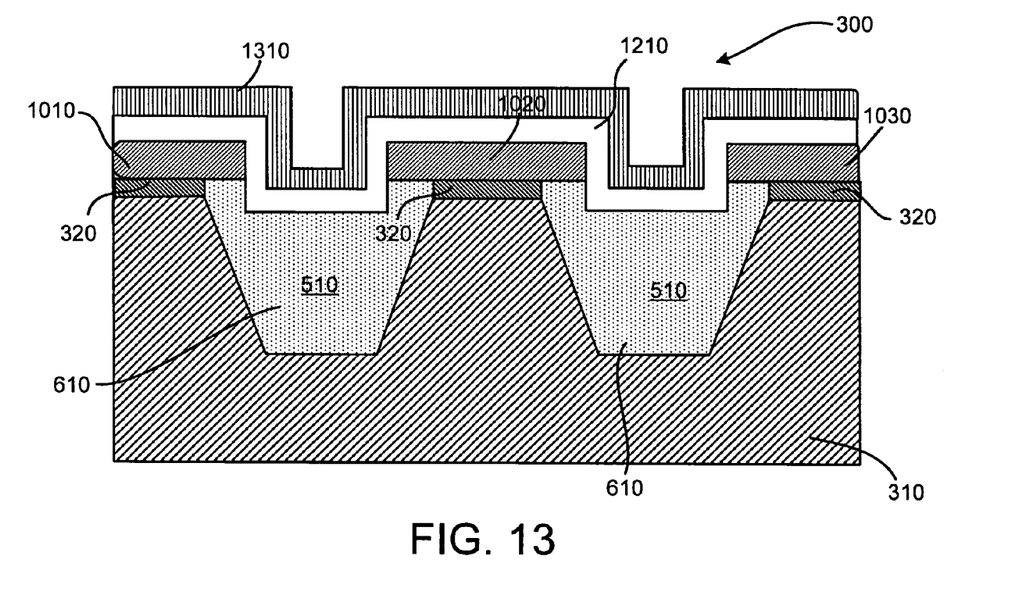

Referring to FIG. 12, an inter-gate dielectric (IGD) layer 1210 may be deposited over the etched FOX layer 610 and floating gates 1010, 1020, and 1030 (act 245). In implementations consistent with principles of the invention, inter-gate dielectric 1210 may be an oxide/nitride/oxide (ONO) stack, a nitride/oxide (NO) stack, a tantalum oxide (e.g., Ta2O5), or any suitable dielectric material. Control gate 1310 may then be formed on inter-gate dielectric 1210, as illustrated in FIG. 13 (act 250).

As illustrated, semiconductor device 300 includes a number of memory cells that each include a tunnel oxide layer 320, a floating gate (e.g., 1010, 1020, 1030), an intergate dielectric 1210, and a control gate (e.g., 1310). Intergate dielectric 1210 wraps around a side portion of the respective floating gates 1010, 1020, and 1030 and provides further isolation between adjacent memory cells, as illustrated in FIG. 13. Advantageously, the formation of dielectric 1210 over a portion of FOX layer 610 helps prevent source/drain leakage in the memory cells of semiconductor device 300. For example, source and drain regions (not shown) may be formed in substrate 310 on opposite sides below dielectric layer 320.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, implementations consistent with the invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 2, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A memory device, comprising:
   a semiconductor substrate;
   a first dielectric layer formed over the semiconductor substrate;
   at least two charge storage elements formed over the first dielectric layer,
   where the semiconductor substrate and the first dielectric layer include a shallow trench filled with an oxide material, the shallow trench having opposing sidewalls, and
   where the oxide material, formed in a center portion of the shallow trench below an upper surface of the semiconductor substrate and between the opposing sidewalls, is removed to provide a region with a substantially rectangular cross-section, and where the oxide material is removed, so that a top surface of the oxide material is in contact with the at least two charge storage elements and does not extend past a top surface of the first dielectric layer; and
   an intergate dielectric formed over at least one of the at least two charge storage elements, the intergate dielectric extending into the center portion of the shallow trench.

2. The memory device of claim 1, where the intergate dielectric extends to a predetermined depth below a plane level with the upper surface of the semiconductor substrate.

3. The memory device of claim 2, where the predetermined depth ranges from about 100 Å to 500 Å.

4. The memory device of claim 1, where the intergate dielectric comprises an oxide-nitride-oxide (ONO) stack formed over the at least two charge storage elements, the ONO stack filling the substantially rectangularly-shaped region formed between the opposing sidewalls of the shallow trench.

5. The memory device of claim 4, further comprising:
   a control gate formed over the ONO stack.

6. A non-volatile memory array, comprising:
   a plurality of memory cells, each including a first dielectric layer formed over a semiconductor substrate, and a charge storage element formed over the first dielectric layer;
   a plurality of isolation regions separating the plurality of memory cells, each of the isolation regions including a trench formed in the semiconductor substrate and including opposing sidewalls, and an oxide formed in the trench, where the oxide located in a center portion of an upper portion of the trench below an upper surface of the semiconductor substrate and between the opposing sidewalls is removed, so that a top surface of the oxide is in contact with the charge storage element and does not extend past a top surface of the first dielectric layer; and
   where each of the plurality of memory cells further comprises:
   an intergate dielectric formed over the charge storage element, the intergate dielectric extending into the center portion of the upper portion of the trench between the sidewalls; and
   a control gate formed over a portion of the intergate dielectric.

7. The non-volatile memory array of claim 6, where the intergate dielectric comprises an oxide-nitride-oxide stack.

8. The non-volatile memory array of claim 6, where the oxide removed from the trench extends to a predetermined depth below a plane level with the upper surface of the semiconductor substrate.

9. The non-volatile memory array of claim 8 where the predetermined depth ranges from about 100 Å to 500 Å.

* * * * *